US010784766B2

(12) United States Patent
Bhandarkar et al.

(10) Patent No.: US 10,784,766 B2
(45) Date of Patent: Sep. 22, 2020

(54) ADAPTIVE SLOPE COMPENSATION FOR CURRENT MODE CONTROL

(71) Applicant: Microchip Technology Incorporated, Chandler, AZ (US)

(72) Inventors: Santosh Manjunath Bhandarkar, Chandler, AZ (US); Alex Dumais, Boise, ID (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 16/428,094

(22) Filed: May 31, 2019

(65) Prior Publication Data

US 2020/0083794 A1 Mar. 12, 2020

Related U.S. Application Data

(60) Provisional application No. 62/728,307, filed on Sep. 7, 2018.

(51) Int. Cl.
*H02M 1/08* (2006.01)
*H03K 5/24* (2006.01)
*H02M 3/157* (2006.01)

(52) U.S. Cl.
CPC ............. *H02M 1/08* (2013.01); *H02M 3/157* (2013.01); *H03K 5/24* (2013.01)

(58) Field of Classification Search
CPC ........... H02M 1/08; H02M 3/157; H03K 5/24
See application file for complete search history.

(56) References Cited

U.S. PATENT DOCUMENTS 7,589,517 B1 9/2009 Broach et al. ............ 324/117 R
8,912,938 B1 * 12/2014 Lu ......................... H02M 3/157
323/284

(Continued)

FOREIGN PATENT DOCUMENTS

| CN | 107104595 A | 8/1917 | ............ H02M 3/158 |
| CN | 107134925 A | 9/1917 | ............ H02M 3/158 |

OTHER PUBLICATIONS

Ridley, Raymond B., "A New Small-Signal Model for Current-Mode Control," PhD Dissertation, Electrical Engineering, Virginia Polytechnic Institute and State University, 225 pages, dated Nov. 27, 1990.

(Continued)

*Primary Examiner* — Gary L Laxton
*Assistant Examiner* — Kevin H Sprenger
(74) *Attorney, Agent, or Firm* — Slayden Grubert Beard PLLC

(57) ABSTRACT

Adaptive slope compensation for current mode control in a switch mode power supply converter is computed for every switching cycle based upon the input voltage and duty-cycle whereby the quality factor is maintained at a constant value. A digital signal processing (DSP) capable microcontroller comprises a voltage loop compensator and generates a desired current reference for every switching cycle. Slope calculations are adapted for switching frequency, inductance value, current circuit gain, etc. The slope calculation result is applied to a pulse-digital-modulation (PDM) digital-to-analog converter (DAC) capable of changing its output levels at a very fast rate compared to the power supply switching frequency whereby the required current slope is provided within the switching period. Actual inductor current may be used to compare against the slope reference, thereby taking care of changes in the inductance values (Continued)

under load. The slope levels are automatically changed when the switching frequency is changed.

17 Claims, 8 Drawing Sheets

(56) References Cited

U.S. PATENT DOCUMENTS

| | | | |
|---|---|---|---|
| 9,048,863 B2 | 6/2015 | Kris et al. | |
| 9,337,811 B1* | 5/2016 | Kris | H03K 3/02337 |
| 9,379,621 B1* | 6/2016 | Kalyanaranman | H02M 3/33507 |
| 9,705,403 B2 | 7/2017 | Nene | |
| 9,899,921 B1 | 2/2018 | Paduvalli | |
| 10,164,650 B2* | 12/2018 | Lu | H03M 1/0617 |
| 2010/0141224 A1 | 6/2010 | Ilic et al. | 323/282 |
| 2013/0033314 A1* | 2/2013 | Gudem | H03F 1/0255 330/96 |
| 2014/0191743 A1* | 7/2014 | O'Driscoll | H02M 3/156 323/282 |
| 2015/0035510 A1* | 2/2015 | Hoshino | H02M 3/157 323/283 |
| 2015/0295619 A1* | 10/2015 | Petrovic | H04L 25/4902 375/130 |
| 2018/0048318 A1* | 2/2018 | Shankar | H02M 3/157 |
| 2018/0205320 A1* | 7/2018 | Galloway | H02M 3/33523 |
| 2019/0149164 A1* | 5/2019 | Lien | H03M 3/37 |

OTHER PUBLICATIONS

International Search Report and Written Opinion, Application No. PCT/US2019/036445, 13 pages, dated Sep. 12, 2019.

* cited by examiner

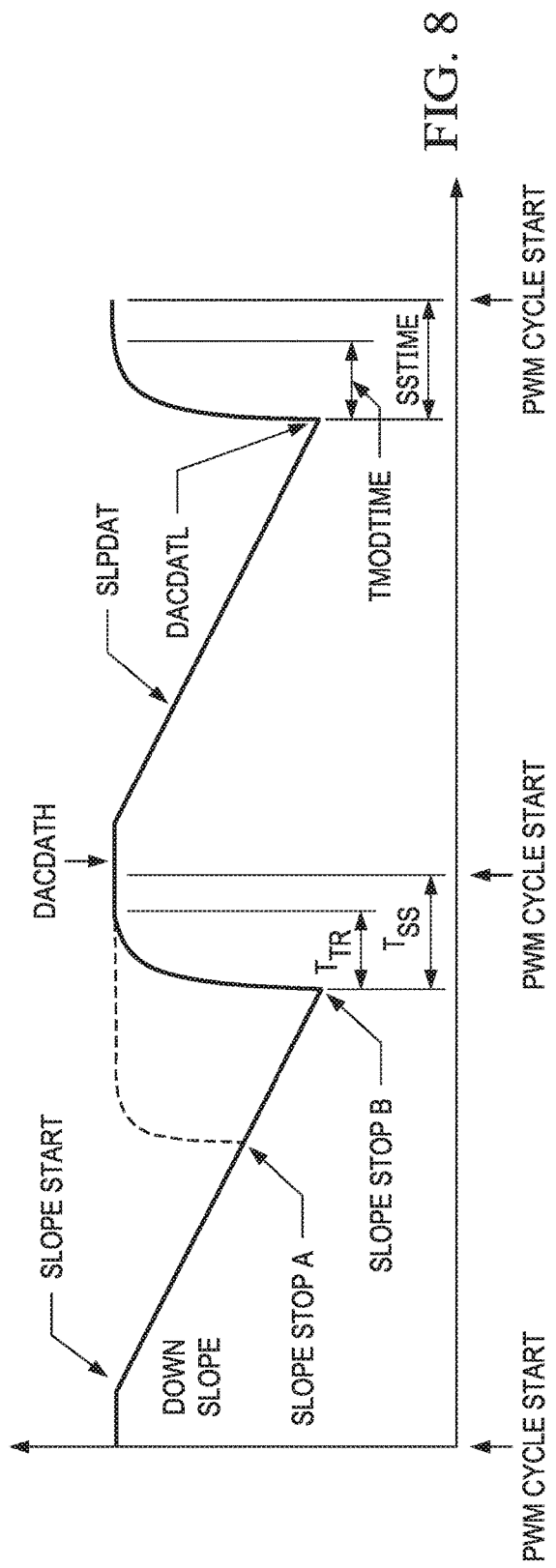
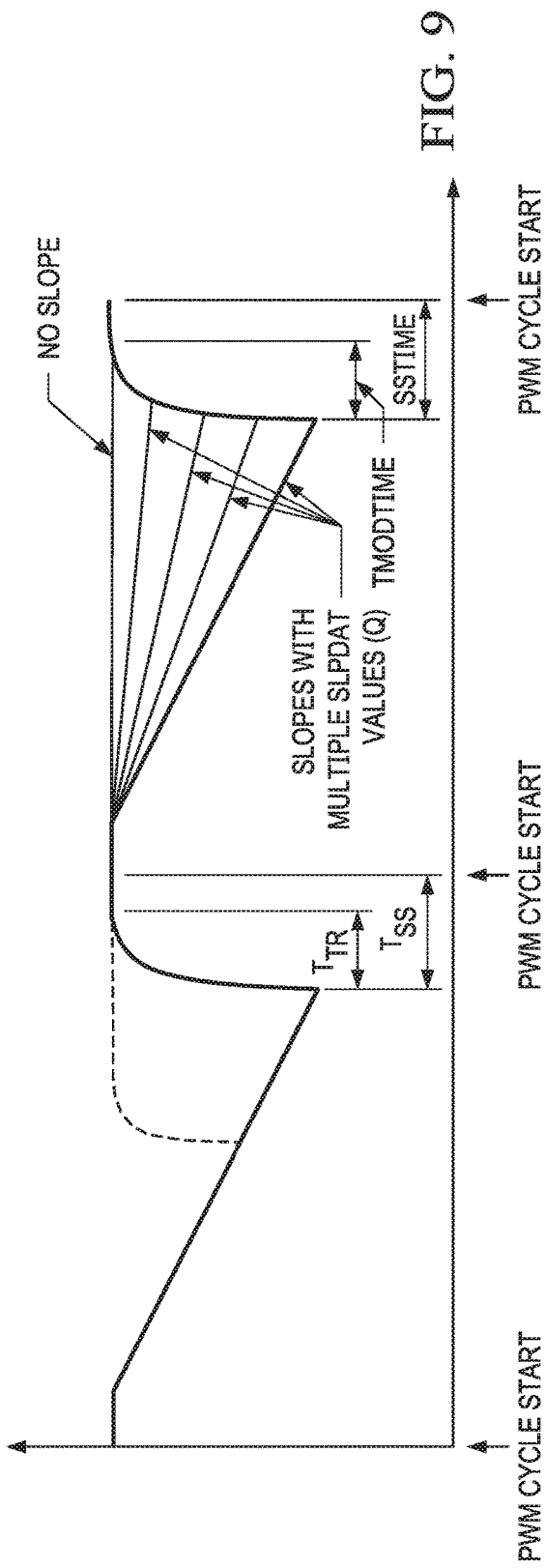

ADAPTIVE SLOPE COMPENSATION FOR CURRENT MODE CONTROL

RELATED PATENT APPLICATION

This application claims priority to commonly owned U.S. Provisional Patent Application Ser. No. 62/728,307; filed Sep. 7, 2018; entitled "Adaptive Slope Compensation for Current Mode Control," by Santosh Manjunath Bhandarkar and Alex Dumais; and is hereby incorporated by reference herein for all purposes.

TECHNICAL FIELD

The present disclosure relates to switch mode power supplies and, more particularly, to adaptive slope compensation for current mode control in a switched mode power supply.

BACKGROUND

Switch mode power supply (SMPS) topologies such as Buck, Boost, and Buck-Boost are widely used to convert voltage from one level to another. Two of the most popular control strategies are current mode control (CMC) and voltage mode control (VMC). Power supply designers use CMC to achieve fast response, cycle by cycle current limiting (used for peak current mode control), ease of paralleling and simplification of compensator design. There are different forms of CMC, with the peak current mode control (PCMC) being widely used. In a PCMC circuit a voltage comparator monitors inductor current converted to a voltage representation and compares it with a generated reference voltage. The on-time of the PWM control signal is truncated when the voltage representing inductor current exceeds this reference voltage.

One of the major drawbacks of using PCMC is the need for slope compensation. This need arises from sub-harmonic oscillations, which occur under specific conditions, such as during continuous current mode (CCM) operation and a duty cycle greater than about 40 percent. These oscillations are caused by the second order poles located at half of the switching frequency.

The sub-harmonic oscillations can be damped by using an external slope compensation network. The quality (Q) factor is dependent upon the duty cycle and the external current ramp used for compensation. An external current ramp is generally designed for worst case, which is typically at full load in analog systems. In such a design, the quality factor continuously changes with duty-cycle changes. This change in quality factor impacts phase margin at the crossover frequency for various load and input voltage conditions. In some cases, particularly at low load conditions, the quality factor can cause the SMPS system to become unstable.

SUMMARY

Therefore, what is needed is a way to maintain a constant quality factor that is independent of changes in the input voltage to the SMPS or load conditions thereof.

According to an embodiment, a method for adaptive slope compensation in an SMPS controller includes determining a supply voltage value, determining an output voltage value of an SMPS, subtracting the output voltage value from a reference voltage value to produce a difference voltage value, calculating a reference current value based upon the difference voltage value, calculating an adaptive slope from the compensated difference voltage value and the input voltage value for each pulse width modulation (PWM) duty cycle such that a quality factor (Q) of the SMPS controller is from about 0.5 to about 1, coupling the adaptive slope and the compensated difference voltage value to inputs of a pulse density modulation (PDM) digital-to-analog converter (DAC), coupling a sloped output over a PWM period from the PDM DAC to a first input of a voltage comparator, coupling a voltage representing current in a power inductor of the SMPS to a second input of the voltage comparator, and coupling an output from the voltage comparator to a PWM generator. The output of the voltage comparator is at a first logic level when the sloped output is less than the voltage representing the current in the power inductor, and at a second logic level otherwise.

According to a further embodiment, an apparatus for adaptive slope compensation is an SMPS controller. The apparatus may include a first ADC with an input adapted for coupling to a supply voltage for an SMPS, a second ADC having an input adapted for coupling to an output voltage of the SMPS, a summer having a first input coupled to an output of the second ADC and a second input coupled to a voltage reference, a compensator having an input coupled to an output of the summer, an adaptive slope calculator function having a first input coupled to an output of the first ADC and a second input coupled to an output of the compensator, an adaptive slope control function having an input coupled to an output of the adaptive slope calculator function, a PDM DAC having a first input coupled to an output of the compensator and a second input coupled to an output of the adaptive slope control function, and a comparator. The comparator includes a first input coupled to an output of the PDM DAC (wherein the PDM DAC provides slope compensation thereto), and a second input coupled to a voltage representing current into an inductor of the SMPS.

According to a another, further embodiment, an SMPS includes an adaptive slope compensation controller, including at least one power switch coupled to a supply voltage, a power inductor coupled to the at least one power switch, a filter capacitor coupled to the power inductor and adapted for providing an output voltage to a load, a first ADC having an input adapted for coupling to the supply voltage, a second ADC having an input adapted for coupling to the output voltage, a summer having a first input coupled to an output of the second ADC and a second input coupled to a voltage reference, a compensator having an input coupled to an output of the summer, an adaptive slope calculation function having a first input coupled to an output of the first ADC and a second input coupled to an output of the compensator, a slope controller having an input coupled to an output of the adaptive slope calculation function, a PDM DAC having a first input coupled to an output of the compensator and a second input coupled to an output of the slope controller, and a comparator. The comparator includes a first input coupled to an output of the PDM DAC (wherein the PDM DAC provides slope compensation thereto), and a second input coupled to a voltage representing current into the power inductor. The controller further includes a PWM generator having an input coupled to an output of the comparator and providing a control signal to the at least one power switch.

BRIEF DESCRIPTION OF THE DRAWINGS

A more complete understanding of the present disclosure may be acquired by referring to the following description taken in conjunction with the accompanying drawings wherein:

FIG. 8 illustrates a schematic waveform diagram of a pulse density modulation (PDM) digital to analog converter (DAC) operation in slope mode, according to specific example embodiments of this disclosure;

FIG. 9 illustrates a schematic waveform diagram of a pulse density modulation (PDM) digital to analog converter (DAC) operation in slope mode showing a plurality of slope shapes with different Q values, according to specific example embodiments of this disclosure;

Figure 1:
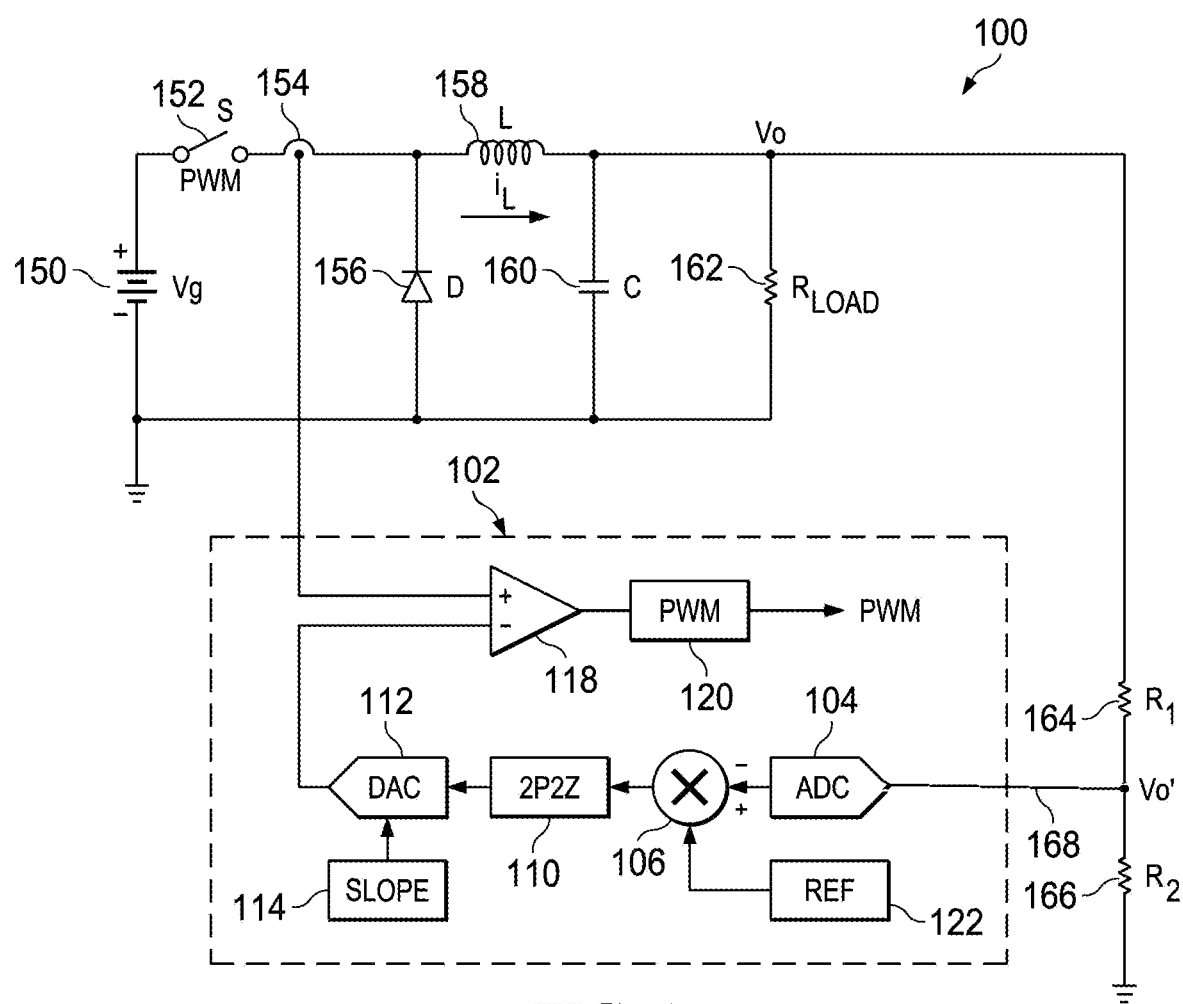
FIG. 1 illustrates a schematic diagram of a prior art switch mode power supply (SMPS) buck converter with peak current mode control.

While the present disclosure is susceptible to various modifications and alternative forms, specific example embodiments thereof have been shown in the drawings and are herein described in detail. It should be understood, however, that the description herein of specific example embodiments is not intended to limit the disclosure to the forms disclosed herein.

DETAILED DESCRIPTION

Embodiments of the present disclosure may maintain a substantially constant Q factor independent of the changes in input voltage or load conditions of a SMPS.

According to specific example embodiments of this disclosure, a comparator may be utilized in combination with a pulse density modulation based digital-to-analog converter (PDM DAC) for generating pulse width modulation (PWM) control signals coupled to power switching transistor(s). An output from the PDM DAC may provide a reference signal to an inverting input of the comparator. This reference signal may be time varying in nature unlike the fixed reference found in most current technology DAC devices. The pulse width modulation (PWM) and comparator (CMP) modules may be used to generate the drive signal for peak current mode control (PCMC).

According to specific example embodiments of this disclosure, the current mode compensation slope may be computed for every switching cycle based upon the input voltage and PWM duty-cycle so that the quality factor is maintained as a constant. A digital signal processing (DSP) capable microcontroller (integrated circuit) may comprise a voltage loop compensator and generate a desired current reference in every switching cycle. The current reference would correspond to the un-compensated duty-cycle of the converter. The PDM DAC may contain a register named SLPDAT, which may be used to control the slope of the ramp in every cycle. This slope may be calculated based on the sampled input voltage and computed peak current. This slope also may depend on, inter-alfa, the switching frequency, inductance value, and current circuit gain that have fixed values. The slope may be either positive or negative, depending on the conditions of the SMPS control application.

The slope calculation result may be applied to the PDM DAC that may be capable of changing its levels at a very fast rate so that no additional circuits in the SMPS power stage are required to work with the DSP or are analog in nature. The PDM DAC may operate at very high frequencies compared to the power supply switching frequency and thus be able to provide a required current slope before the next switching period it is used in. Thus, it is possible to achieve superior performance using a single DSP function in the microcontroller without requiring any additional analog circuits. Using this method, the actual inductor current may be used to compare against the slope reference, thereby taking care of changes in the inductance values under load. This solution is particularly useful where the SMPS has a wide input voltage range. Another advantage of this solution is the automatic change in the slope levels when the switching frequency is changed. Such behavior is desired in interleaved converters where, depending on the number of power converters, the switching frequency can be changed for various load levels.

Referring now to the drawings, the details of example embodiments are schematically illustrated. Like elements in the drawings will be represented by like numbers, and similar elements will be represented by like numbers with a different lower-case letter suffix.

Referring to FIG. 1, depicted is a schematic diagram of a switch mode power supply (SMPS) buck converter with peak current mode control, according to embodiments of the present disclosure. The SMPS buck converter, generally represented by the numeral 100, may comprise a power switch 152 that couples a supply voltage (Vg) from a power source 150 to a power inductor 158, a current-to-voltage sensor-converter 154, a flywheel diode 156, a filter capacitor 160, and a pulse width modulation (PWM) controller 102 having slope control. A load 162 is coupled to the voltage regulated output, Vo, of SMPS buck converter 100. PWM controller 102 may comprise an input comparator 118, a PWM generator 120, a digital-to-analog converter (DAC) 112, a slope control circuit 114, a digital compensator 110 (for example but not limited to a two-pole, two-zero compensator), a digital summer 106, an analog-to-digital converter (ADC) 104, and a digital voltage reference 122. ADC 104 is coupled to an output voltage Vo'. A scaled down SMPS output voltage Vo' 168 of the output voltage Vo from voltage divider resistors 164 and 166 may be converted into a digital representation thereof with first ADC 104. Voltage comparator 118 compares a voltage representative of the current in inductor 158 with a slope compensated voltage from DAC 112. Operation of SMPS buck converter 100 is well known to one having ordinary skill in the art of SMPS design.

Figure 10:
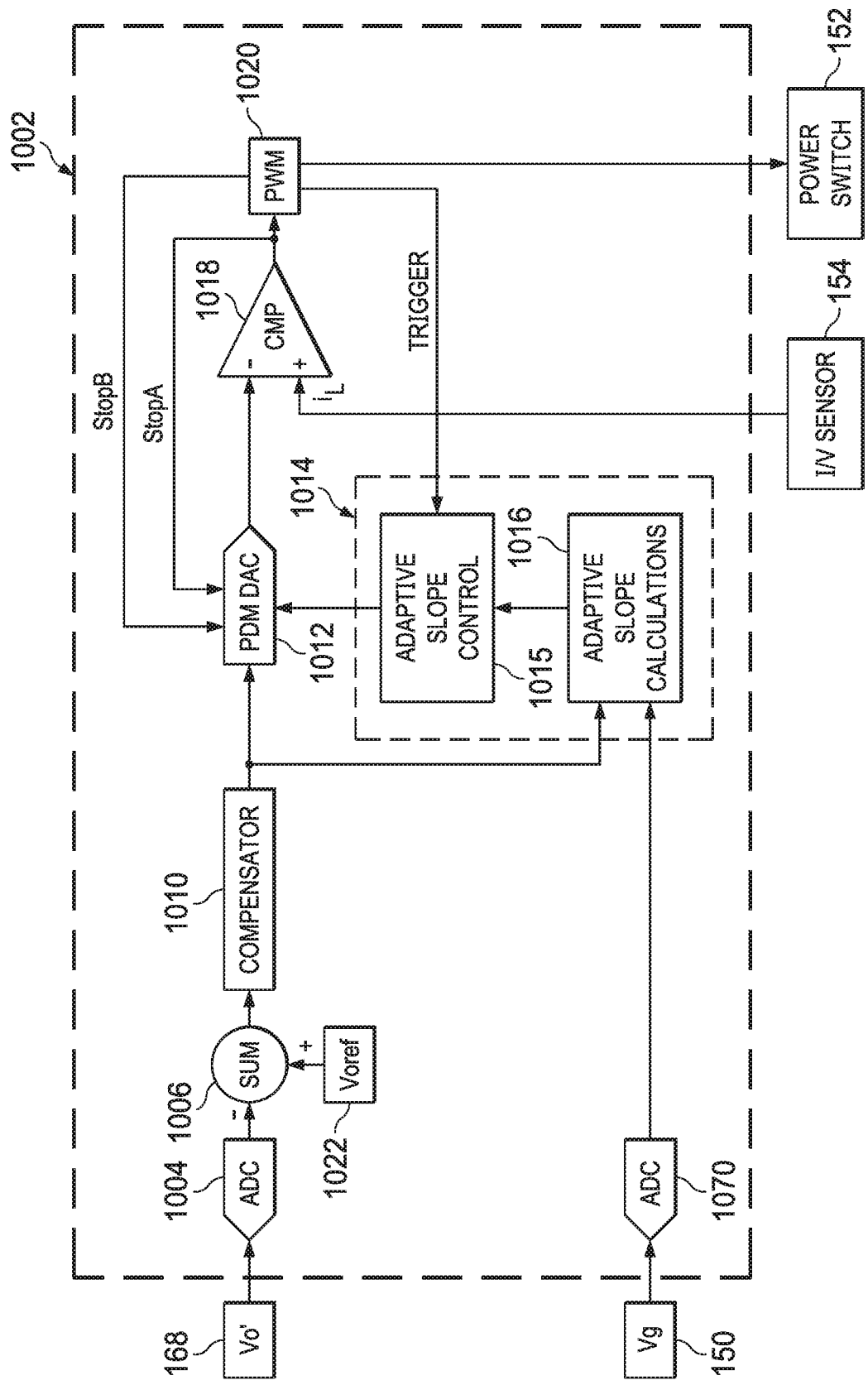
FIG. 10 illustrates a schematic block diagram of a PWM controller comprising adaptive slope compensation, according to specific example embodiments of this disclosure.

Referring to FIG. 10, depicted is a schematic block diagram of a PWM controller comprising adaptive slope compensation, according to specific example embodiments of this disclosure. A PWM controller 1002 comprising adaptive slope compensation may be used to control the power components shown in FIG. 1 to provide a SMPS with adaptive slope compensation. PWM controller 1002 may have digital signal processing capabilities and may comprise a first analog-to-digital converter (ADC) 1004, a digital summer 1006, a digital voltage reference 1022, a digital compensator 1010, a pulse density modulation based digital-to-analog converter (PDM DAC) 1012, an adaptive slope control circuit 1014 comprising an adaptive slope control function 1015 and an adaptive slope calculation function 1016, a second ADC 1070, an input comparator 1018, and a pulse width modulation (PWM) generator 1020.

The output of first ADC 1004 may be coupled to a first input of digital summer 1006 (negative input shown), and digital voltage reference 1022 may be coupled to a second input (positive input shown) of digital summer 1006. The output of the digital summer 1006 may be coupled to digital compensator 1010. An output from digital compensator 1010 may be coupled to a first input of PDM DAC 1012. The output of digital compensator 1010 is a digital number which is converted into an equivalent analog voltage by PDM DAC 1012. The output of PDM DAC 1012 starts at a value provided by digital compensator 1010 at the start of the PWM cycle. A slope value from the adaptive slope control function 1015 may be coupled to a second input of PDM DAC 1012 and used to change a fixed output of PDM DAC 1012 into a value with a slope such that the value varies with time over a PWM period. Operation of a PDM DAC with slope compensation, but without adaptive slope compensation as taught herein, is known to those skilled in art and is described in commonly owned U.S. Pat. No. 9,048,863 whose entire contents are incorporated herein by reference.

Figure 2:
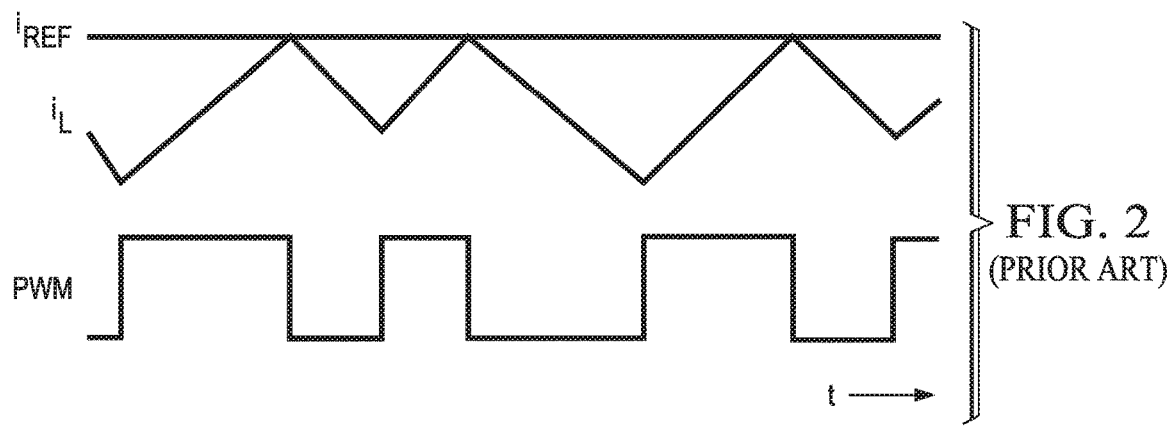
FIG. 2 illustrates schematic waveform diagrams of a prior art pulse width modulation (PWM) and inductor current waveforms without slope compensation.

Adaptive slope control function 1015 and adaptive slope calculation function 1016 may be provided by digital signal processing. A microcontroller having digital signal processing capabilities may be used for PWM controller 1002. Slope calculations by adaptive slope control function 1015 may be performed just before the start of a new PWM cycle, see FIG. 8 time period $T_{TR}$. Then new calculated slope information may be provided to PDM DAC 1012 from adaptive slope control function 1015 before the start of the next PWM cycle (e.g., starting at the conclusion of transient time $T_{SS}$ shown in FIG. 8). The output of PDM DAC 1012 is fed to an inverting input of analog input comparator 1018, and the output of current-to-voltage sensor-converter 154 is fed to the non-inverting input of analog input comparator 1018. When the non-inverting analog input is greater than the inverting input of analog input comparator 1018 its output is at a logic high, and when the inverting input is greater than the non-inverting input of analog input comparator 1018 its output is at a logic low. The output of analog input comparator 1018 is fed to the input of PWM generator 1020, whereby the output of PWM generator 1020 controls power switch 152. PWM generator 1020 preferably generates a pulse of fixed duration or frequency. At the start of the PWM cycle, the output of PWM generator 1020 is at a logic high. This turns on switch 152, which as shown in FIG. 1 thereby applies input voltage Vg across inductor 158. The current $i_L$ through inductor 158 starts rising linearly as shown in FIG. 2. A voltage of the inductor current $i_L$ representation generated by current-to-voltage sensor-converter 154 may be coupled to the non-inverting input of analog input comparator 1018. Whenever the voltage representation of the inductor current $i_L$ exceeds the level at the inverting input of analog input comparator 1018, the output of PWM generator 1020 changes its logic state from high to low, thereby turning off switch 152. As a result, the current through inductor 158 starts decreasing. The output of PWM generator 1020 will turn back to a logic high again after a fixed time duration has elapsed. The fixed time duration refers to the PWM frequency. Analog input comparator 1018 controls the PWM high-to-low transition. The low to high (LH) transition of the output of PWM generator 1020 occurs after a fixed duration from the previous LH transition. This takes place after PWM time base reaches the preset count.

SMPS operational information may be provided to the adaptive slope calculation function 1016 as follows: A supply voltage (Vg) from power source 150 (FIGS. 1 and 10) is converted to a digital representation thereof with second ADC 1070. This digital representation of the voltage Vg is provided to adaptive slope calculation function 1016, through second ADC 1070, for use in determining the desired slope for the next PWM cycle. A second input to adaptive slope calculation function 1016 may be provided as follows: a scaled down SMPS output voltage Vo' 168 of the output voltage Vo from voltage divider resistors 164 and 166 (see FIG. 1) may be converted into a digital representation thereof with first ADC 1004. This digital voltage representation is applied to a negative input of digital summer 1006. A digital representation of a desired output voltage is provided by digital voltage reference 1022 and input to a positive input of digital summer 1006. The resultant output from digital summer 1006 may be applied to digital compensator 1010, e.g., two-pole, two-zero filter function. The output from digital compensator 1010 may be provided to a first input of PDM DAC 1012, as described above, and a second input of adaptive slope calculation function 1016. Adaptive slope calculation function 1016 may perform the necessary calculations for the next PWM cycle slope to be used based upon variables comprising the input voltage Vg and the compensated difference between scaled output voltage Vo' 168 and digital reference voltage 1022. Also used in determining the next PWM cycle slope value may be fixed parameters such as inductance value L of inductor 158, sampling time Ts of first ADC 1004, current circuit gain Ri, frequency of PWM generator 1020, and operating frequency of PDM DAC 1012. Ri is the gain of the current-to-voltage sensor-converter 154. If a current transformer is used it is equal to CT gain*Burden Resistor. If a shunt resistor (Rsh) and an operational amplifier (opamp) with gain are used, Ri is equal to Rsh*Gain (opamp).

The calculated slope value for the next PWM cycle may be provided to adaptive slope control function 1015 from adaptive slope calculation function 1016. Signals Stop A, which is the output of analog input comparator 1018, and Stop B, which is an output of PWM generator 1020, may be used in cooperation with the calculated slope value to modify how PDM DAC 1012 outputs (analog) converted digital values from digital compensator 1010, e.g., changes slope, as will be described further in relation to FIG. 5. An analog voltage having the desired slope is output from PDM DAC 1012 to inverting input of analog input comparator 1018. A voltage representing the current into power inductor 158, i.e. $i_L$, is provided by current-to-voltage sensor-converter 154 (see FIGS. 1 and 10) to a non-inverting input of analog input comparator 1018. The output of analog input comparator 1018 will be at a logic high when the voltage at its inverting input is less than the voltage at its non-inverting input and visa-versa, as described above and will be described further in relation to FIG. 3. The output from analog input comparator 1018 may then be used for controlling PWM generator 1020 so as to produce PWM drive signals to power switch(es) 152, e.g., switching power transistor(s) that connects and disconnects the supply voltage Vg from power source 150 to/from power inductor 158, as shown in FIG. 1. Adaptive slope control function 1015 and adaptive slope calculation function 1016 may be provided by a digital signal processing (DSP) function in a microcontroller, e.g., Microchip DsPIC, without requiring any additional analog circuits. The calculated slope for each PWM cycle provides a desired and constant Q factor independent of changes in the supply voltage Vg or load conditions of the SMPS. Any parameters of the SMPS that may change during operation thereof are factored into calculation of the slope used for the next PWM cycle.

Referring to FIG. 2, depicted are a prior art schematic waveform diagram of pulse width modulation (PWM) and inductor current waveforms without slope compensation. The duty cycle varies between the adjacent cycles in such a way that average duty cycle is held constant based on the input voltage and load conditions.

Figure 3:
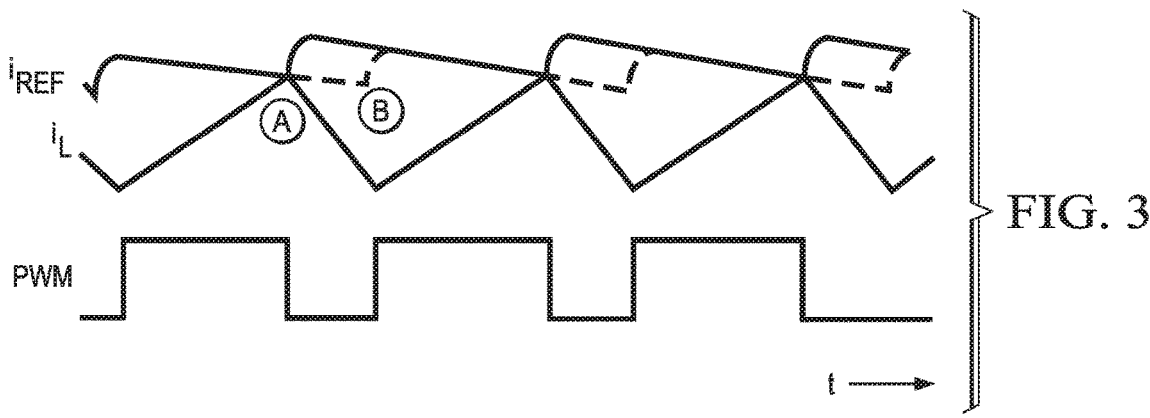
FIG. 3 illustrates schematic waveform diagrams of PWM and inductor current waveforms with slope compensation, according to teachings of the present disclosure.

Referring to FIG. 3, depicted are schematic waveform diagrams of PWM and inductor current waveforms with slope compensation, according to teachings of the present disclosure. The addition of an external ramp to the current reference ensures that the duty cycle is constant in each cycle. In FIG. 3, the duty cycle has changed compared to the PWM signal shown in FIG. 2.

Figure 4:
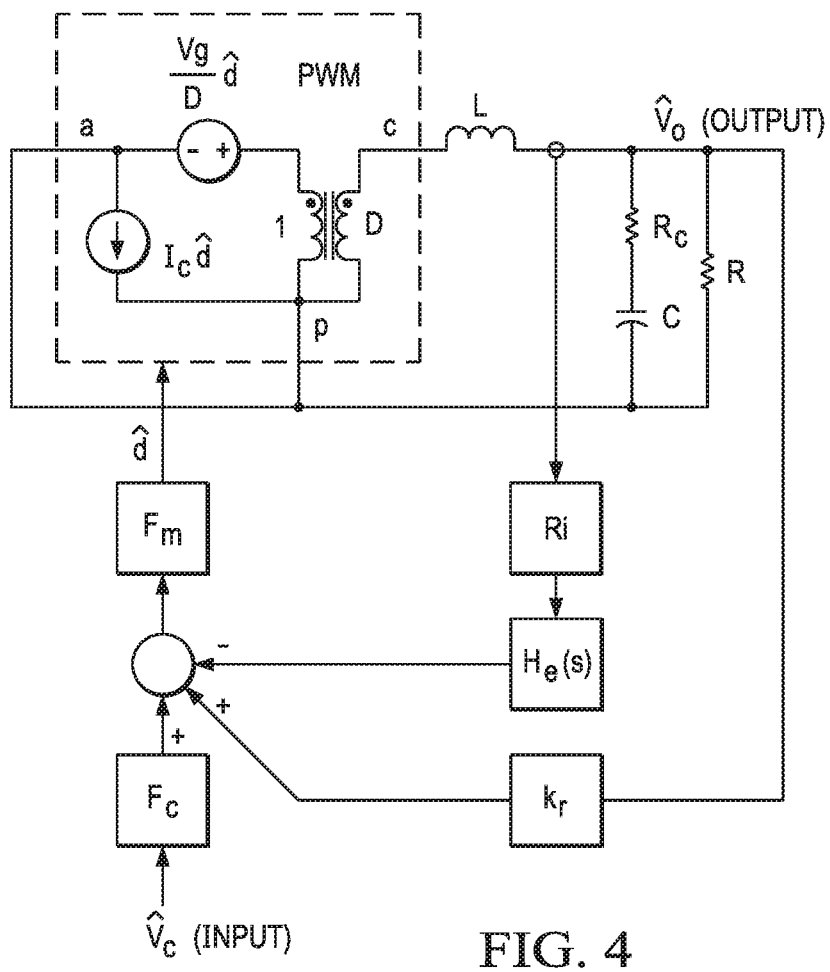
FIG. 4 illustrates a prior art schematic diagram of a buck converter plant model.

Referring to FIG. 4, depicted is a schematic diagram of a buck converter plant model. The model is used to derive the control transfer function for a PCMC. The diagram of FIG. 4 is found in R. B. Ridley, "A New Small-Signal Model for Current-Mode Control", PhD Dissertation, Virginia Polytechnic Institute and State University, November 1990.

Figure 5:
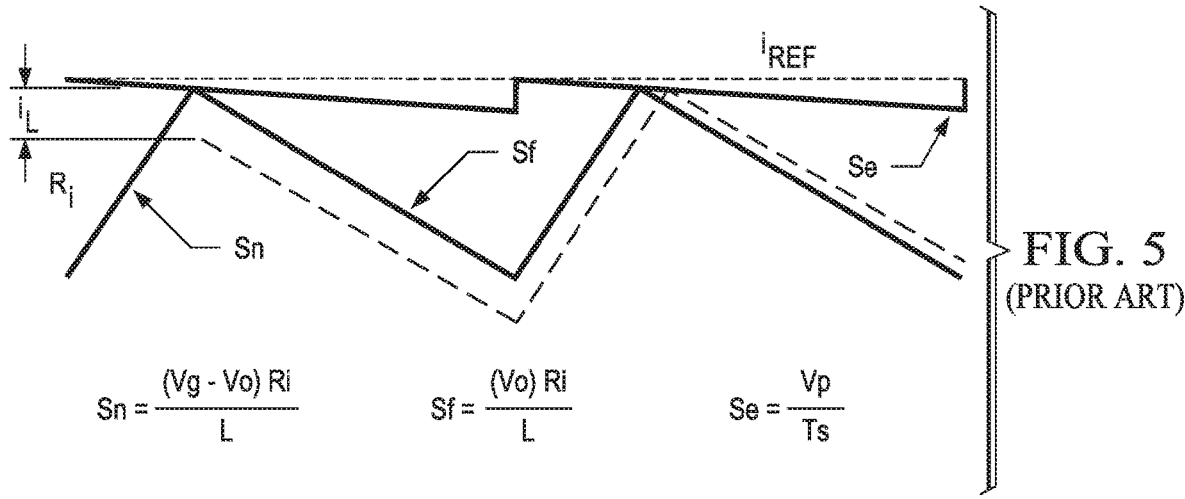
FIG. 5 illustrates a prior art schematic waveform diagram of a slope waveform reference.

Referring to FIG. 5, depicted is a schematic waveform diagram of a slope waveform reference, according to teachings of the present disclosure. FIG. 5 illustrates the slope of inductor current $i_L$ at different times. The diagram of FIG. 5 is found in R. B. Ridley, "A New Small-Signal Model for Current-Mode Control", PhD Dissertation, Virginia Polytechnic Institute and State University, November 1990. Sn indicates the inductor current slope during the ON time, while Sf is the inductor slope during the OFF time. As applied to embodiments of the present disclosure, the external slope, provided by adaptive slope control circuit 1014, is indicated by Se and can be added to digital reference voltage 1022 or the actual inductor current $i_L$ whose representation is provided by current-to-voltage sensor-converter 154. The equation for Se will be explained further below. The external slope Se starts with a reference value Iref and gradually slopes downward during the PWM cycle. The Iref value is provided by the compensator and would be the reference for comparison of inductor current $i_L$ if no external slope was required or used.

Figure 6:
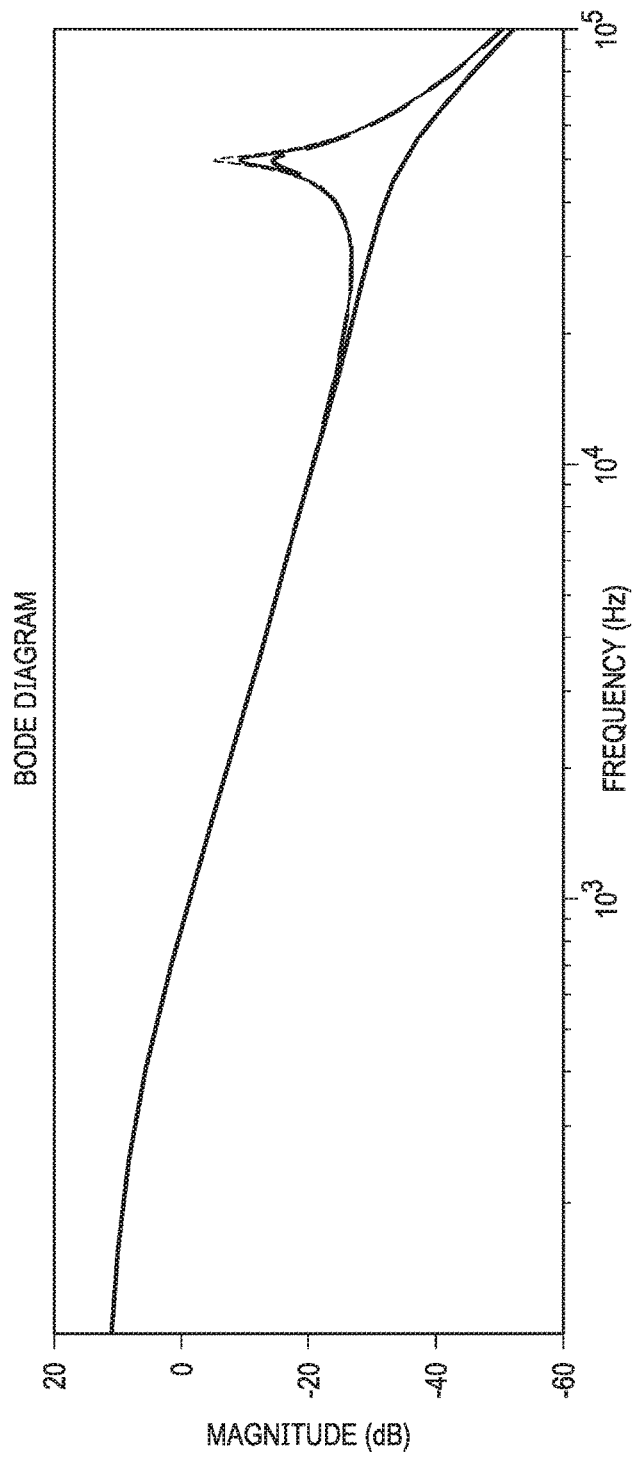
FIG. 6 illustrates schematic waveform diagrams of a buck plant transfer function with multiple Q values, according to teachings of the present disclosure.

Referring to FIG. 6, depicted are schematic waveform diagrams of a buck plant transfer function with multiple Q values, according to teachings of the present disclosure. A high Q causes the gain to move closer to the 0-dB mark at half the switching frequency. The phase undergoes a 180-degree phase shift at half the switching frequency, and care should be exercised to keep the gain away from 0-dB for stable operation.

Figure 7:
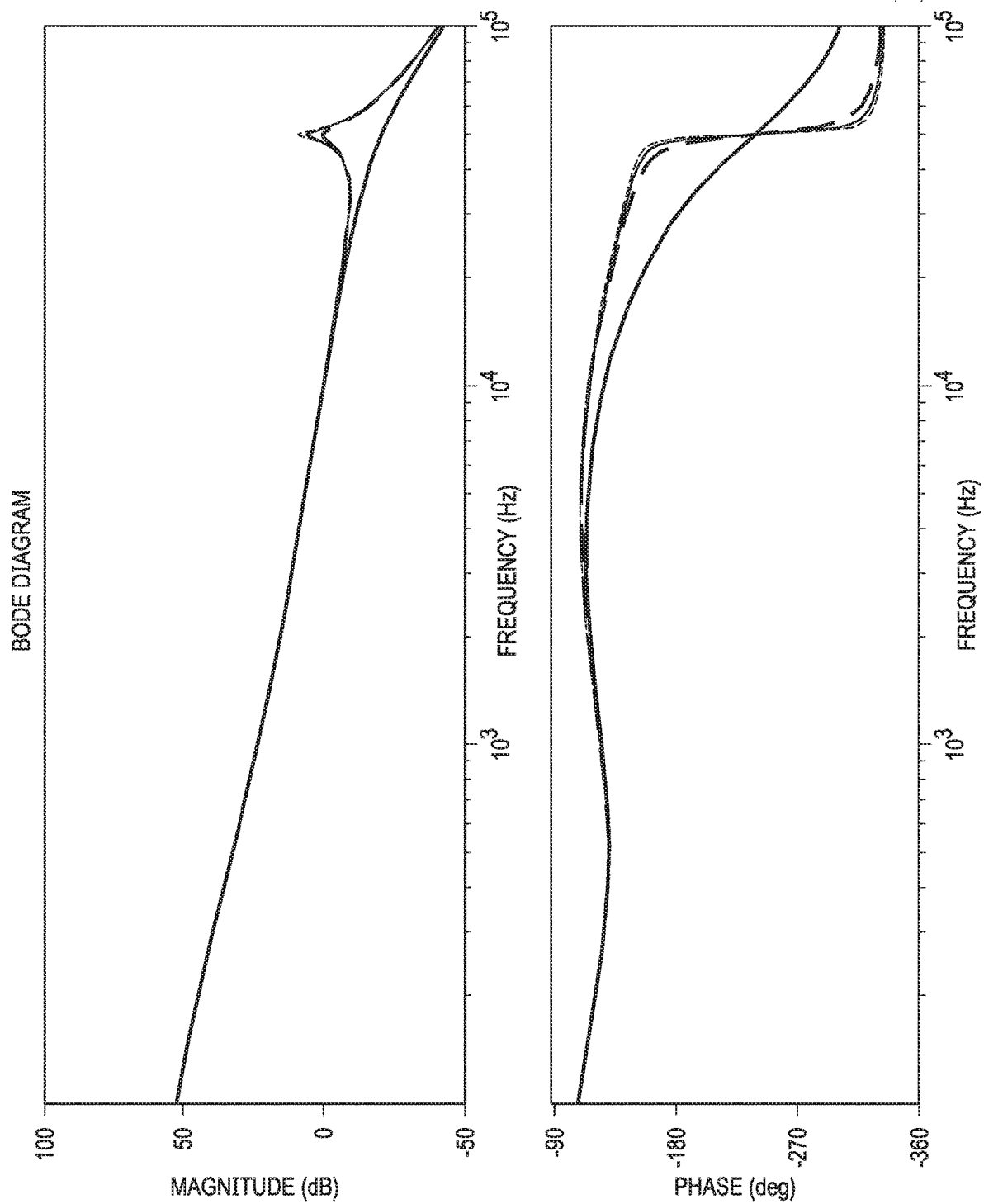
FIG. 7 illustrates schematic waveform diagram of a buck plant transfer function with loop gain and different Q values, according to teachings of the present disclosure.

Referring to FIG. 7, depicted are schematic waveform diagrams of a buck plant transfer function with loop gain with different Q values, according to teachings of the present disclosure. Even though the peak shown in FIG. 6 does not cross the 0-dB point, it crosses it in FIG. 7 which makes the system unstable. Loop gain comprises the plant transfer function and the compensator 1010. The lower Q (Q=1) ensures that the gain is away from the 0-dB mark at half the switching frequency. The open loop transfer gain of the system comprises the plant gain and the gain of compensator 1010. Compensator 1010 is generally designed for worst case operating conditions such as full load and maximum input voltage. The compensator design basically deals with the crossover frequency point rather than the half switching frequency. In FIG. 7, the crossover frequency occurs around 10 kHz, while the half switching frequency is at 50 kHz. The compensator is preferably designed to get the optimal transient response by providing a phase margin in the range of 45-60 degrees at the crossover frequency. If the high frequency switching dynamic is ignored, the overall system is stable under all operating conditions. However, with different input voltages and loads, the Q factor at half switching frequency can cause the gain to cross at 0-dB. At this point the phase is rapidly changing and if it crosses 180-degrees, the system becomes unstable and can produce erratic output. A lower Q ensures that there is enough damping in the system to prevent the gain peaking as shown in FIG. 6. If the Q can be set to a lower value such as '1' under all operating conditions for a given plant and compensator, the system would be stable under all operating conditions and its transient response will be decided by the phase margin at the crossover frequency. The buck converter is considered for explanation, but the same concept is applicable for other types of converters such as boost, buck-boost, without limitation.

Referring to FIG. 8, depicted is a schematic waveform diagram of a pulse density modulation (PDM) digital to analog converter (DAC) operation in slope mode, according to specific example embodiments of this disclosure. PDM DAC 1012 operates at a frequency much higher than the frequency of PWM generator 1020 and is able to output a time varying output with a slope aligned with the PWM signal. Coordination between PWM generator 1020 and PDM DAC 1012 may be by signals Trigger, Stop A, and Stop B. The slope is characterized by a reference current Iref at the start of the PWM cycle. Its level at the start is provided by digital compensator 1010 which is the reference for the inductor current to follow at the start of the slope (DACDATH) and at the end of the slope (DACDATL). The SLPDAT is a value required to achieve the desired slope. The start of the slope may be synchronized with the start of the PWM cycle or may be delayed for an appropriate time value based on the design requirement that is purely up to the designer to decide where to start the slope. There is flexibility to start (delay from PWM start) by a delay value $T_{SS}$, which may be 0 and typically may be from about 40 to 60 percent. The slope start may be controlled by the Trigger signal generated by PWM generator 1020 and can be delayed by a predetermined time from the start of the PWM cycle. For instance, the slope can be started from the instant of the PWM cycle and can go all the way up to the end of the PWM cycle minus a transient time $T_{SS}$, e.g., a time duration required by PDM DAC 1012 to reset its value back to DACDATH. In general, the start delay may typically be from about 40 to 50 percent of the PWM period. $T_{SS}$ is the time required for PDM DAC 1012 to settle at steady state value (Tsteadystate). $T_{SS}$ value may be fixed based upon an internal design of PDM DAC 1012. For example, a Microchip Incorporated CH series DsPIC microcontroller may have a $T_{SS}$ value fixed at about 0.6 microseconds, which is about 6% for a 100 kHz PWM frequency. Therefore, the slope can start at 0 and can go up to 94% for 100 kHz. $T_{SS}$ consists of the transient time $T_{TR}$ (Ttransient) and settling time.

The slope has two stop signals "Stop A" and "Stop B", as shown in FIGS. 3 and 10, the receipt of which is denoted in FIG. 3 as "A" and "B", respectively. Analog input comparator 1018 may be configured to have its output coupled to adaptive slope control function 1015 (not shown). The Stop A signal may be used by PDM DAC 1012 to truncate the slope generation and reach the value required at the start of the next cycle as provided by digital compensator 1010. The Stop A signal is typically the output of analog input comparator 1018. Whenever the output of analog input comparator 1018 goes high, the Stop A signal goes high and truncates the slope generation process for the present PWM cycle.

Whenever analog input comparator 1018 input signal exceeds the reference value provided by PDM DAC 1012, the PWM cycle is truncated. The output value of PDM DAC 1012 is reset back to the DACDATH value to start the sloped output for the next PWM cycle. The subsequent PWM cycle is started after the present PWM cycle time has elapsed. The second stop signal Stop B may be used to truncate the PWM cycle in the absence of Stop A signal and is generated by PWM generator 1020. The Stop A signal is controlled by the output from analog input comparator 1018. This ensures that the duty cycle of the PWM signal is below 100%. The Stop B signal may be asserted by PWM generator 1020 at a time value of $T_{TR}$ before the end of the PWM cycle, as shown in FIG. 8. The time duration $T_{TR}$ is required by the PDM DAC 112 to reset its value back to DACDATH. TMODTIME is a register that may control the time duration $T_{TR}$. SSTIME is a register that may control the transient time $T_{SS}$.

Referring to FIG. 9, depicted is a schematic waveform diagram of a pulse density modulation (PDM) digital to analog converter (DAC) operation in slope mode showing a plurality of slope shapes with different Q values, according to specific example embodiments of this disclosure. The objective is to find a slope for a given set of operating conditions such that the effective value of Q equals '1' (one). This may be done by changing the slope of the PDM DAC 1012 output as shown in FIG. 9. On the left in FIGS. 8 and 9 are the timing nomenclatures, and on the right are register names controlling the timing. The slope is calculated in every PWM cycle based on the current and voltage values sampled in the previous cycle and may be provided by the adaptive slope control circuitry 1014 to the PDM DAC 1012. The equation for calculating the slope is provided hereinafter. The slope value gets incremented or decremented from the steady state value provided by the digital compensator 1010 depending on the determined positive or negative slope by adaptive slope control circuitry 1014. The resulting value gets converted into an equivalent analog output by PDM DAC 1012, which forms the input to analog input comparator 1018.

Figure 11:
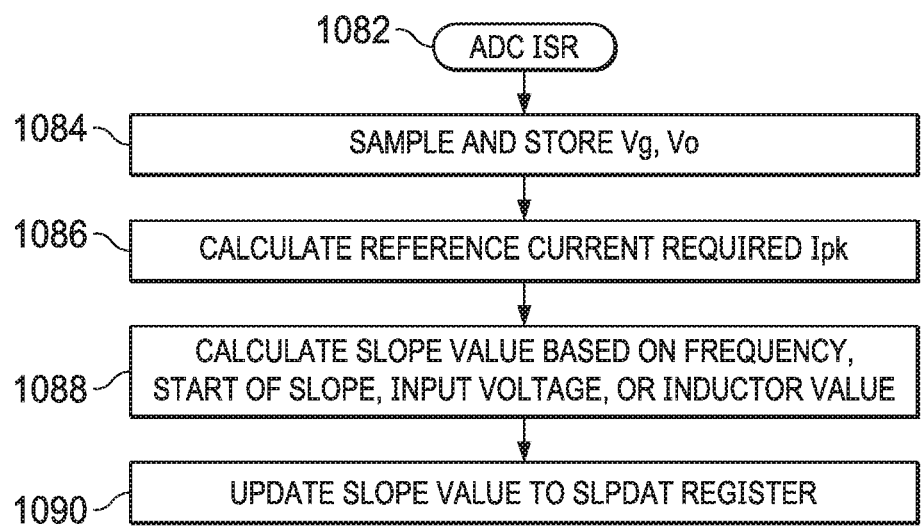
FIG. 11 illustrates a schematic flow diagram for an interrupt subroutine, according to a specific example embodiments of this disclosure.

Referring to FIG. 11, depicted is a schematic flow diagram for an interrupt subroutine, according to a specific example embodiment of this disclosure, performed by adaptive slope calculation function 1016. Step 1082 is an ADC interrupt service routine (ISR) that initiates the following program: The ADC interrupt routine is triggered at a fixed interval in every PWM cycle, typically at the start of the PWM cycle. The ISR is run by the microcontroller implementation of PWM controller 1002 which may be a dsPIC C series microcontroller from Microchip. The microcontroller comprising PWM controller 1002 consists of internal modules such as ADC, PDM DAC, comparator and PWM generator.

In step 1084, the input and the output voltages (Vg, Vo) are sampled and stored as variables provided by the outputs of the respective first and second ADCs 1004, 1070. In step 1086, digital compensator 1010 calculates the value of the reference current Ipk required responsive to the difference between the output of first ADC 1004 (i.e., scaled output voltage Vo') and the output of digital voltage reference 1022. This is a closed loop system where the output of digital compensator 1010 provides the current reference, which is used to compare the actual inductor current provided by current-to-voltage sensor-converter 154. Digital compensator 1010 is an admittance block which taken in a voltage input difference and provides current reference. The design of digital compensator 1010 is done using a pole-zero placement method.

Digital compensator 1010 is basically a filter that takes the output voltage error from digital summer 1006 as an input and outputs the desired inductor current. Digital compensator 1010 implementation may be, for example, but not limited to: a PID, a two-pole, two-zero (2P2Z); a three-pole, three-zero (3P3Z). In step 1088, the slope value (SLPDAT) is calculated based on the recent current reference value Ipk and other parameters explained hereinabove. In step 1090, the slope value (SLPDAT) is updated from adaptive slope control function 1015 to PDM DAC 1012 for use in providing the slope characteristics for the next PWM cycle.

Figure 12:
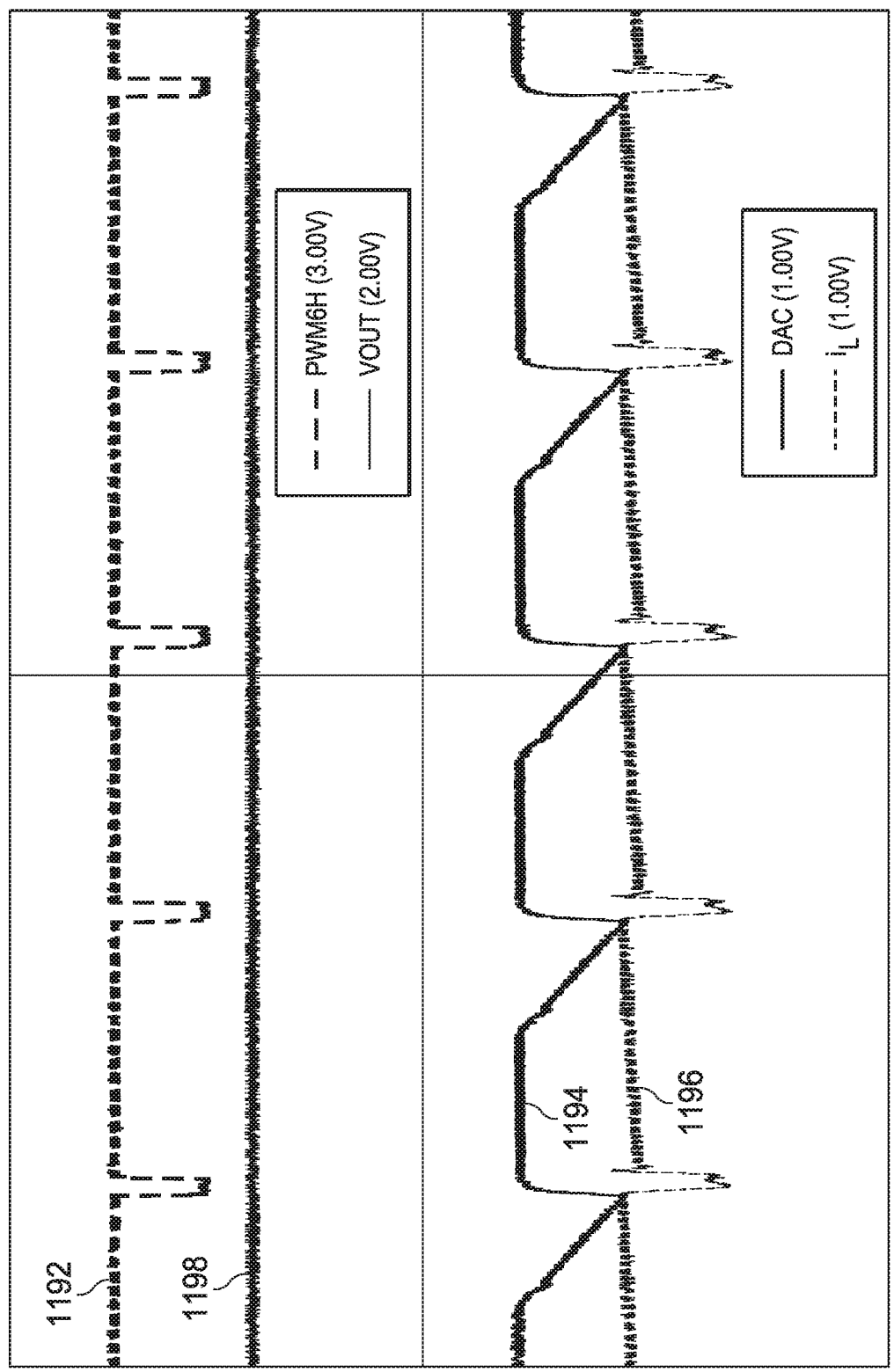
FIG. 12 illustrates oscillograph waveform diagrams of buck converter slope compensation waveforms, according to specific example embodiments of this disclosure.

Referring to FIG. 12, depicted are oscillograph waveform diagrams of buck converter slope compensation waveforms, according to specific example embodiments of this disclosure. The duty cycle of PWM signal 1192 in the example is higher than 50 percent and is close to around 90 percent. DAC waveform 1194 slope starts at about 50 percent of the PWM waveform. Slope compensation is required when the duty cycle is greater than 40 percent. This need arises from sub-harmonic oscillations, which occur under specific conditions, such as during continuous current mode (CCM) operation and a duty cycle greater than about 40 percent. These oscillations are caused by the second order poles located at half of the switching frequency. The description above regarding FIG. 8 more fully discloses the relationship of the slope start to the PWM duty cycle. When inductor current 1196 exceeds the DAC slope level, the PWM cycle is truncated and the PWM output will be zero till the PWM period has elapsed. Output voltage (VOUT) 1198 is shown at a constant 3.280 volts direct current (DC).

The PWM waveform in FIG. 2 shows the impact of sub-harmonic oscillations due to which the duty cycle is not fixed, but changes between alternate cycles. The control loop under such conditions is marginally stable, and it is desired to have a stable control loop. Adding an external slope to the current or the reference current as shown in FIG. 5 solves the issue of marginal stability. FIG. 3 shows stabilized waveforms with slope compensation. This is observed by the constant ON time in the waveform. The uncompensated waveforms for the same condition are shown in FIG. 2. Note the ON time change in the subsequent cycles.

However, the Q factor at half the switching frequency determines the amount of external slope needed for a stable operation. The slope value (SLPDAT) is used by the adaptive slope control function 1015. SLPDAT is calculated by adaptive slope control function 1015 and provided to PDM DAC 1012. PDM DAC 1012 uses the SLPDAT value to control its output value and may be calculated in every PWM cycle based on the value of the computed current reference as calculated in step 1088 shown in FIG. 11. The formulae used for calculating the SLPDAT value for a buck converter is explained next. The same approach is applicable for other converters such as boost and buck-boost, except for the difference in the respective control to output transfer function.

Calculation of slope may be illustrated using the Buck converter circuit as an example for ease of understanding. The equations derived are based on Dr. Ridley's work (R. B. Ridley, "A New Small-Signal Model for Current-Mode Control", PhD Dissertation, Virginia Polytechnic Institute and State University, November 1990). The control to output transfer function for a Buck converter may be derived from the Buck model shown in FIG. 4. The control-to-output transfer function may be given by:

$$\frac{vo}{vc} = \frac{R}{Ri} \frac{1}{1 + \frac{RTs}{L}[mcD' - 0.5]} Fp(s) Fh(s)$$

where $$Fp(s) = \frac{1 + sCRc}{1 + \frac{s}{\omega p}}$$

$$\omega p = \frac{1}{CR} + \frac{Ts}{LC}(mcD' - 0.5)$$

$$Fh(s) = \frac{1}{1 + \frac{s}{\omega n Q} + \frac{s^2}{\omega n^2}}$$

$$Q = \frac{1}{\pi(mcD' - 0.5)}$$

$$\omega n = \frac{\pi}{Ts}$$

$$mc = 1 + \frac{Se}{Sn}$$

$$Sn = \frac{(Vg - Vo)Ri}{L}$$

$$Sf = \frac{(Vo)Ri}{L}$$

$$Se = \frac{Vp}{Ts}$$

$$D' = 1 - D$$

The term Fh(s) signifies the high frequency component of the transfer function and appears at Fs/2, where Fs is the sampling frequency which is the same as the PWM switching frequency. The quality factor Q depends on the duty cycle and external slope. The damping available in the system is inversely proportional to the Q factor. As the Q value increases, the damping reduces thereby increasing the peak in the transfer function.

The value of Q selected decides the behavior of the transfer function at Fs/2. If the value of Q equals 0.707, the transfer function signifies critical damping and any value below it leads to over damping. The value of Q=1 ensures stability for the operation of the power supply across the operating conditions. For Q=1, the slope value Se can be derived from the above equations as:

$$Se = (D - 0.18) * Ri * Vg/L$$

The slope value may be derived as:

$$Vp = (D - 0.18) * Ri * \frac{Vg}{L} * Ts$$

PDM DAC 1012 slope value may be derived as:

$$Vpd = Vp * 2^{Ndac}/Vdac$$

Where Ndac is the resolution bits of PDM DAC 1012, Vdac is the reference voltage of PDM DAC 1012, Ts is the Sampling frequency (Hz)=1/Fpwm, and Fpwm–PWM frequency (Hz).

PDM DAC 1012 operates at a very high frequency Fdac, which is typically around 500 MHz for certain microcontroller devices. As can be seen from FIG. 8, the DAC needs a minimum time $T_{TR}$ to revert to the top of the slope from the minimum level. This is typically around 0.6 μs. This allows a time of Ts–$T_{TR}$ for the slope as given below.

$$Tslope = Ts - T_{TR}$$

The value in the SLPDAT register controls the slope and is calculated as:

$$SLPDAT = Vpd * 16/(Tslope/Tdac)$$

$$SLPDAT = \left(Ipk - 0.18 * \frac{Vg}{L} * Ts\right) * Ri * 16/(Tslope/Tdac)$$

16 is used in fixed point math to provide an appropriate value. Multiplying by 16 converts the result from Q15 format to Q12 format.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

What is claimed is:

1. A method for adaptive slope compensation in a switch mode power supply (SMPS) controller, said method comprising:
   determining a supply voltage value;
   determining an output voltage value of a switch mode power supply (SMPS);
   subtracting the output voltage value from a reference voltage value to produce a difference voltage value;
   calculating a reference current value based upon the difference voltage value;
   calculating an adaptive slope from the compensated difference voltage value and the input voltage value for each pulse width modulation (PWM) duty cycle such that a quality factor (Q) of the SMPS controller is from 0.5 to 1;
   coupling the adaptive slope and the compensated difference voltage value to inputs of a pulse density modulation (PDM) digital-to-analog converter (DAC);
   coupling a sloped output over a PWM period from the PDM DAC to a first input of a voltage comparator;
   coupling a voltage representing current in a power inductor of the SMPS to a second input of the voltage comparator; and
   coupling an output from the voltage comparator to a PWM generator, wherein the output of the voltage comparator is at a first logic level when the sloped output is less than the voltage representing the current in the power inductor, and at a second logic level otherwise.

2. The method according to claim 1, wherein the step of calculating the adaptive slope comprises the step of calculating the adaptive slope before a next PWM duty cycle that uses that adaptive slope.

3. The method according to claim 2, wherein the step of calculating the adaptive slope for each PWM duty cycle comprises the step of calculating the adaptive slope based upon the compensated difference voltage value and the input voltage value of a previous PWM duty cycle.

4. The method according to claim 1, further comprising the step of selecting a starting point of the adaptive slope to the PDM DAC from 40 to 60 percent of the PWM duty cycle.

5. The method according to claim 1, further comprising the step of varying a starting point of the adaptive slope to the PDM DAC.

6. The method according to claim 5, wherein the step of calculating the adaptive slope further comprises the step of modifying the adaptive slope based upon selecting any one or more from a group consisting of a frequency, start of a slope, an input voltage and an inductor value.

7. The method according to claim 1, wherein:
the step of determining the output voltage value of the SMPS is done with a first analog-to-digital converter (ADC);
the step of determining the supply voltage value is done with a second ADC; and
the step of subtracting the output voltage from the reference voltage is done with a digital summer coupled to outputs of the first and second ADCs.

8. An apparatus for adaptive slope compensation in a switch mode power supply (SMPS) controller, comprising:
a first analog-to-digital converter (ADC) having an input adapted for coupling to a supply voltage for a switch mode power supply (SMPS);
a second ADC having an input adapted for coupling to an output voltage of the SMPS;
a summer having a first input coupled to an output of the second ADC and a second input coupled to a voltage reference;
a compensator having an input coupled to an output of the summer;
an adaptive slope calculator function having a first input coupled to an output of the first ADC and a second input coupled to an output of the compensator;
an adaptive slope control function having an input coupled to an output of the adaptive slope calculator function;
a pulse-density-modulation (PDM) digital-to-analog converter (DAC) having a first input coupled to an output of the compensator and a second input coupled to an output of the adaptive slope control function; and
a comparator comprising:
a first input coupled to an output of the PDM DAC, wherein the PDM DAC provides slope compensation thereto; and
a second input coupled to a voltage representing current into an inductor of the SMPS.

9. The apparatus according to claim 8, wherein an output of the comparator provides a control signal to a pulse width modulator.

10. The apparatus according to claim 8, wherein the adaptive slope calculation function performs a slope calculation for the slope controller to be used by the PDM DAC for providing adaptive slope compensation to the comparator for control of the pulse width modulator.

11. The apparatus according to claim 10, wherein the slope calculation is finished before a next PWM duty cycle starts.

12. The apparatus according to claim 10, wherein the slope calculation is based upon a compensated difference voltage value and an input voltage value of a previous PWM duty cycle.

13. The apparatus according to claim 8, wherein the SMPS controller comprises a microcontroller.

14. The apparatus according to claim 13, wherein the microcontroller has digital signal processing capabilities.

15. A switch mode power supply (SMPS) having an adaptive slope compensation controller, comprising:
at least one power switch coupled to a supply voltage;
a power inductor coupled to the at least one power switch;
a filter capacitor coupled to the power inductor and adapted for providing an output voltage to a load;
a first analog-to-digital converter (ADC) having an input adapted for coupling to the supply voltage;
a second ADC having an input adapted for coupling to the output voltage;
a summer having a first input coupled to an output of the second ADC and a second input coupled to a voltage reference;
a compensator having an input coupled to an output of the summer;
an adaptive slope calculation function having a first input coupled to an output of the first ADC and a second input coupled to an output of the compensator;
a slope controller having an input coupled to an output of the adaptive slope calculation function;
a pulse-density-modulation (PDM) digital-to-analog converter (DAC) having a first input coupled to an output of the compensator and a second input coupled to an output of the slope controller; and
a comparator comprising
a first input coupled to an output of the PDM DAC, wherein the PDM DAC provides slope compensation thereto, and
a second input coupled to a voltage representing current into the power inductor; and
a PWM generator having an input coupled to an output of the comparator and providing a control signal to the at least one power switch.

16. The SMPS according to claim 15, wherein a microcontroller provides the first and second ADCs, the summer, the compensator, the adaptive slope calculator, the slope controller, the PDM DAC, the comparator and the PWM generator.

17. The SMPS according to claim 16, wherein the microcontroller has digital signal processing capabilities.

* * * * *